(12) United States Patent
Mekhiel

(10) Patent No.: US 10,044,496 B2
(45) Date of Patent: Aug. 7, 2018

(54) BANDWIDTH AMPLIFICATION USING PRE-CLOCKING

(71) Applicant: EMPIRE TECHNOLOGY DEVELOPMENT LLC, Wilmington, DE (US)

(72) Inventor: Nagi Mekhiel, Markham (CA)

(73) Assignee: Empire Technology Development LLC, Wilmington, DE (US)

( * ) Notice: Subject to any disclaimer, the term of this patent is extended or adjusted under 35 U.S.C. 154(b) by 130 days.

(21) Appl. No.: 15/101,935

(22) PCT Filed: Mar. 21, 2014

(86) PCT No.: PCT/US2014/031425
§ 371 (c)(1),
(2) Date: Jun. 6, 2016

(87) PCT Pub. No.: WO2015/142350
PCT Pub. Date: Sep. 24, 2015

(65) Prior Publication Data
US 2016/0308666 A1    Oct. 20, 2016

(51) Int. Cl.
*H04L 7/00* (2006.01)
*G06F 1/04* (2006.01)
(Continued)

(52) U.S. Cl.
CPC ............. *H04L 7/0091* (2013.01); *G06F 1/04* (2013.01); *H03K 5/15066* (2013.01); *H04L 7/0008* (2013.01); *H04L 12/4013* (2013.01)

(58) Field of Classification Search
CPC ....... G06F 1/04; G11C 29/022; G11C 29/023; G11C 7/1078; G11C 7/1093; G11C 7/222;
(Continued)

(56) References Cited

U.S. PATENT DOCUMENTS

| | | | |
|---|---|---|---|
| 6,430,697 B1 * | 8/2002 | Muljono | ............. G06F 13/4226 710/35 |
| 7,375,558 B2 | 5/2008 | Frank et al. | |

(Continued)

OTHER PUBLICATIONS

International Search Report and Written Opinion for International Application No. PCT/US2014/031425 dated Sep. 3, 2014.
(Continued)

*Primary Examiner* — Vineeta Panwalkar
(74) *Attorney, Agent, or Firm* — IP Spring

(57) ABSTRACT

Technologies are generally described herein for bandwidth amplification using a pre-clock signal to latch data at a latch in an input register of a sender section while passing the data through a multiplexer of the sender section in a serial manner. In some configurations, pre-clocking the multiplexer can allow for parallel operations to occur within the sender section, thus hiding or reducing the effects of certain serialization delays associated with the multiplexer. Furthermore, the pre-clocking of the multiplexer, in some configurations, hides or reduces the register latch hold and setup delays. A method may create three levels of parallelization of latencies between a sender circuit, a serialization circuit, and a receiver circuit by overlapping them at same time.

19 Claims, 11 Drawing Sheets

(51) Int. Cl.
*H03K 5/15* (2006.01)
*H04L 12/40* (2006.01)

(58) Field of Classification Search
CPC ............ Y02B 60/1228; Y02B 60/1235; H04L 7/0091; H04L 12/4013; H04L 7/0008; H03K 5/15066
See application file for complete search history.

(56) References Cited

U.S. PATENT DOCUMENTS

| 7,460,565 B2 | 12/2008 | Dally et al. |
| 2012/0063557 A1 | 3/2012 | Tanaka et al. |
| 2012/0207196 A1 | 8/2012 | Zerbe et al. |

OTHER PUBLICATIONS

Tsai, W-Y., et al., "A novel MUX-FF circuit for low power and high speed serial link interfaces," Proceedings of IEEE International Symposium on Circuits and Systems, pp. 4305-4308 (May 30, 2010-Jun. 2, 2010).

* cited by examiner

BANDWIDTH AMPLIFICATION USING PRE-CLOCKING

CROSS-REFERENCE TO RELATED APPLICATION

This Application is the U.S. National Stage filing under 35 U.S.C. § 371 of International Application No. PCT/US14/31425, filed on Mar. 21, 2014. International Application No. PCT/US14/31425 is herein incorporated by reference in its entirety.

BACKGROUND

Unless otherwise indicated herein, the materials described in this section are not prior art to the claims of this application and are not admitted to be prior art by inclusion in this section.

Various typos of buses may be bandwidth limited. Instances in which bandwidth is limited can increase the time to transfer data between a processor and memory, or other component, thereby reducing performance of an entire computing system. Bandwidth limitation may also decrease the scalability of computing systems that utilize central processing units ("CPUs") with more than one processor core (e.g. multi-core processors) when using a shared bus with limited bandwidth to transfer data between the different cores. Bandwidth limitations can also cause visual and graphical imperfections due to as graphical processing unit ("GPU") being unable to transfer data to and from memory at a sufficient rate to provide an acceptable graphical output. Thus, bandwidth limitations and circuit delays can decrease the performance of a computer.

In one example of a memory read operation illustrating limitations of some conventional memory systems, a core of a processor may send a request to read data from an output buffer or output register of a memory. The memory may decode the requested address and may output the data to its buffer. Then, a memory controller may assert a data ready signal for the processor to read the data on the bus from the buffer on the following edge of a clock. The processor, in response to receiving the data ready signal at a following edge of the clock, may store the data to an input register, or buffer, using edge triggered flip-flops.

In order to receive and process the correct order of data, latches used in a memory read operation typically may attempt to satisfy timing requirements. Some timing requirements may include a setup time, which is a time allotted to increase the probability that the data is stable and ready before the data is read. Another timing requirement may include a hold time, which is a time allotted to the latches to maintain the data so as to increase the probability that data is read before changing to other data. In addition to these timing requirements (which result in timing delays), other delays may be present in a memory circuit. For example, there may be a delay between sensing a clock edge and when a flip-flop outputs its data.

After waiting for these timing parameters (or delays), the processor can read data from its input register. At a data sender section of the memory system, which may include the memory's output register, the data may also be latched using sender flip-flops and may have similar requirements as receiver flip-flops at a data receiver section of the memory system. Thus, these sender flip-flops at the data sender section may be timed in order to meet the setup and hold times, in addition to any delays between a clock edge and output from one or more flip-flops.

The data to be transferred typically may be first latched in one or more sender flip-flops and then latched in one or more receiver flip-flops. The double latching arrangement may take at least two clock cycles in order to increase the likelihood that the data is being sent and received in the same order. When using this arrangement, the clock speed for the bus may need to be made slower so as to account for the total time required for latching data in the flip-flops, including the setup time, hold time, and delay of output. The reduced speed of the clock for the bus may result in degradation of performance.

SUMMARY

In one example, a method to increase a rate of data transfer is described. The method includes receiving a pre-clock signal having a first frequency at an input register of a sender section, receiving at least one input data at the input register, latching the at least one input data in the input register using the pre-clock signal as an activation signal to provide latched data, and selecting, at a multiplexer of the sender section, the latched data to be output to a receiver section as serialized data output at approximately a same time the latched data is latched and becomes available in the input register using a plurality of bus signals synchronized with the pre-clock signal to generate the serialized data output.

In another example, a data bandwidth amplification circuit is described. The data bandwidth amplification circuit includes a sender section and a receiver section. The sender section is operative to receive data front memory for a requesting computing component. The sender section includes an input register and a data multiplexer. The input register is configured to receive as inputs the data from the memory and a pre-clock signal. The input register is further configured to provide a data output, wherein the input register is operative to selectively receive the data from the memory. The data multiplexer is coupled to the input register and is configured to receive as inputs the data output from the input register, a plurality of bus signals generated from the pre-clock signal. The data multiplexer is configured to provide a serialized data output, wherein the pre-clock signal and the plurality of bus signals are operative to synchronize the input register and the data multiplexer so that the data multiplexer is configured to select data from as latch in the input register at approximately a same time the data is latched at the latch in the input register.

The receiver section of the bandwidth amplification circuit is coupled to the sender section and is operative to receive the serialized data output from the sender section. The receiver section comprises a plurality of latches configured to receive the pre-clock signal alone, to be used to generate the bus signals locally at the receiver, or a plurality of activation signals (in this case, the pre-clock signal may not be needed at the receiver section), and responsive to the plurality of activation signals to provide an output of output data. The receiver section is operative to be synchronized with the data multiplexer.

In a still further example, a computer is described that implements a mechanism for data bandwidth amplification. The computer includes a bus, a central processing unit coupled to the bus, and a memory controller coupled to the bus. The memory controller is operative to control a circuit. The circuit includes as sender section and a receiver section. The sender section is operative to receive data from memory in response to a request for the data from a requester component. The sender section includes an input register operative to latch data from the memory, to receive a pre-clock signal input, and to provide a data output. The input register is operative to selectively receive the data from the memory.

The sender section also includes a data serializer multiplexer. The data serializer multiplexer coupled to the input register and configured to receive an input of the data from the input register, the pre-clock signal, a plurality of bus signals, and configured to provide a serialized data output. The pre-clock signal and the plurality of bus signals are operative to synchronize the input register and the data multiplexer so the data multiplexer is configured to select data in the input register at approximately a same time the data is latched in the input register.

The receiver section of the bandwidth amplification circuit is coupled to the sender section and is operative to receive data from the sender section to be sent to the requestor component. The receiver section comprises a plurality of latches configured to receive the pre-clock signal and or the plurality of bus signals and to output data. The receiver section is operative to be synchronized with the data multiplexer. The plurality of latches of the receiver section comprise a first output latch configured to latch data on a rising edge of a first signal of the plurality of bus signals, a second output latch of the plurality of receiver latches configured to latch data on a rising edge of the second signal of the plurality of bus signals, a third output latch of the plurality of receiver latches configured to latch data on a falling edge of second signal of the plurality of bus signals, and a fourth output latch of the plurality of receiver latches configured to latch data on a falling edge of the first signal of the plurality of bus signals.

The foregoing Summary is illustrative only and is not intended to be in any way limiting. In addition to the illustrative aspects, embodiments, and features described above, further aspects, embodiments, and features will become apparent by reference to the Figures and the following Detailed Description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
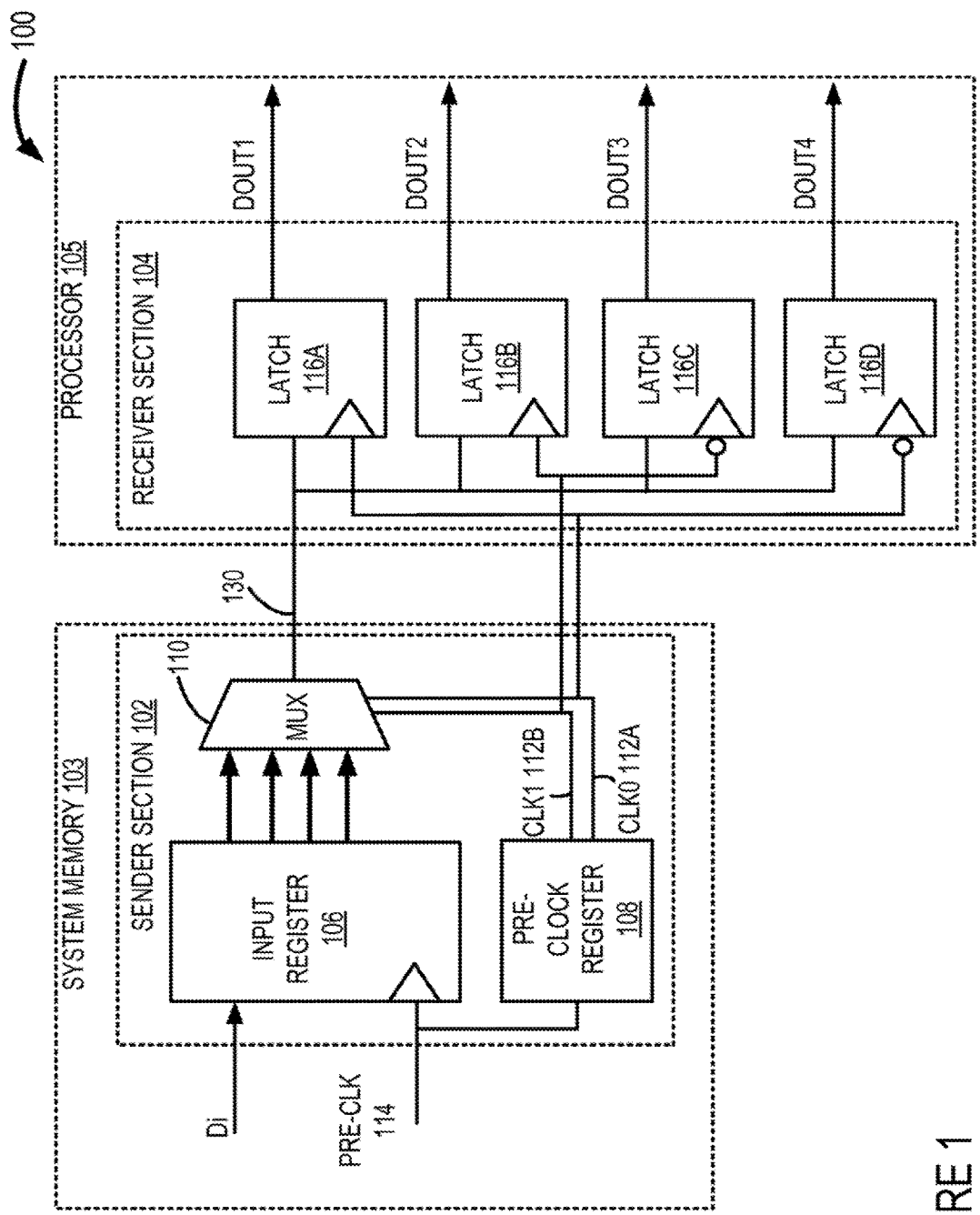
FIG. 1 is a schematic circuit diagram illustrating a bandwidth amplification circuit.

In the following detailed description, reference is made to the accompanying drawings, which form a part hereof In the drawings, similar symbols typically identify similar components, unless context dictates otherwise. The illustrative embodiments described in the detailed description and drawings are not meant to be limiting. Other embodiments may be utilized, and other changes may be made, without departing from the spirit or scope of the subject matter presented herein.

The aspects of the present disclosure, as generally described herein, and illustrated in the figures, can be arranged, substituted, combined, separated, and designed in a wide variety of different configurations, all of which are explicitly contemplated herein. Further, one or more components of various figures described below may not be included in the figure for purposes of clarity. This should not be construed as a disclaimer or admission that the non-included components do not form part of the subject matter described herein. Additionally, one or more figures may use a "dashed" line as a border to visually encapsulate one or more components. Unless specifically described otherwise, the use of a dashed line is for purposes of illustration and does not reflect functional or physical boundaries.

This disclosure is generally drawn, inter alia, to technologies for a bandwidth amplification circuit that uses a pre-clock signal to synchronize the latching of data with one or more multiplexers. Briefly stated, technologies are generally described herein for bandwidth amplification on data buses. As used herein, "bandwidth amplification" may refer to a condition of a memory system configured to have an increase of data throughput in the memory system, as compared to some other memory systems. It is noted herein, though, that the present disclosure is not necessarily dependent on any increase in the amount of data throughput over other memory systems. In some examples, the use of various technologies may be used in lieu of or in conjunction with existing memory data transfer operations.

Various examples of the presently disclosed subject matter may utilize a multiphase pre-clock signal (a "pre-clock") to synchronize a data serializer multiplexer and its input register. In some configurations, the data serializer multiplexer may be configured so that at the same time, or approximately the same time, the data serializer multiplexer receives a select signal to receive input from a latch in the input register, and the input register latches data from memory. The simultaneous, or near simultaneous latching/multiplexing aspect disclosed herein may, in some configurations, allow a sender section to transfer data from a memory in a manner that compensates for certain timing delays that may be inherent in the data sender section, thereby increasing the transmission frequency.

In some examples, the pre-clock signal may be used as an activation signal for one or more latches in the input register. In some configurations, pre-clocking the multiplexer can allow for parallel operations to occur within the bandwidth amplification circuit, which in some configurations can hide or minimize (or otherwise reduce) certain serialization delays associated with the multiplexer. Furthermore, the pre-clocking of the multiplexer, in some configurations, can hide hold and setup delays associated with latching in the input register. In some configurations, by synchronizing the data input and output, as well as performing parallel operations to at least partially hide certain delays, the amount and/or rate of data that can be transferred through a bandwidth amplification circuit can be greater than conventional and/or other data transfer circuits. One or more examples provided herein may create three levels of parallelization of latencies between a sender circuit, a serialization circuit, and a receiver circuit by essentially causing the latencies to occur at approximately the same time. Thus, in some examples, the latencies are overlapped, occurring in a parallel, rather than serial, fashion.

FIG. 1 is a schematic circuit diagram illustrating a bandwidth amplification circuit 100, arranged according to at least some embodiments presented herein. The bandwidth amplification circuit 100 may be embodied by a circuit apparatus that includes a sender section 102 and a receiver section 104 coupled to the sender section 102. Although not limited to any particular arrangement, in some examples, the sender section 102 may be included as one or more components in a system memory 103, and the receiver section 104 may be included as one or more components in a processor 105. In other configurations, the bandwidth amplification circuit 100 may be one or more components included in the system memory 103, illustrated by way of example in FIG. 11, below. These and other configurations, including, but not limited to, the bandwidth amplification circuit 100 being a separate component from either the system memory 103 or the processor 105, are considered to be within the scope of the present disclosure. For bidirectional transfer, a processor and a memory may include a sender section and receiver section, respectively, having configurations that are similar to or otherwise based on the configuration of FIG. 1 shown and described herein.

Referring back to FIG. 1, the sender section 102 may include an input register 106, a pre-clock register 108, and a data multiplexer in the form of a data serializer multiplexer 110, coupled to each other. The input register 106 may receive and may latch data Di, which is data provided on a data bus, and a pre-clock signal 114. The data serializer multiplexer 110 may receive as an input data from the input register 106, and may receive as select/control signals a CLK0 bus signal 112A and a CLK1 bus signal 112B from the pre-clock register 108. The data serializer multiplexer 110 may output data as serialized data to the receiver section 104 using a memory bus 130.

The receiver section 104 may include receiver latches 116A-116D (hereinafter collectively and generically referred to as the "receiver latches 116"). The receiver latches 116 may receive the CLK0 bus signal 112A, the CLK1 bus signal 112B, and the serialized data from the data serializer multiplexer 110 as inputs. The receiver latches 116 may respectively output data DOUT1-DOUT4, which may be parallelized data representing the data Di that is read into the input register 106. The DOUT1-DOUT41 data may be provisioned to a processor core of the processor 105 or other requesting component.

In one example operation, the sender section 102 may receive data Di at the input register 106. The data Di may be latched at the input register 106. The pre-clock register 108 may generate and provide the CLK0 bus signal 112A and the CLK1 bus signal 112B as select signals to control the data serializer multiplexer 110, explained in more detail in FIGS. 2 and 3 below. The data Di may be selected for multiplexing into serialized data using the CLK0 bus signal 112A and the CLK1 bus signal 112B and may then be output by the data serializer multiplexer 110 to the receiver section 104. The data at the output of the data serializer multiplexer 110 may be based on the values of the CLK0 bus signal 112A and the CLK1 bus signal 112B, explained in more detail in FIGS. 6 and 7 below. The serialized data may be latched in one of the receiver latches 116 of the receiver section 104 and then made available to a requesting component.

In some configurations, the select signals, CLK1 bus signal 112B and CLK0 bus signal 112A, may direct the data serializer multiplexer 110 to a particular data input from the input register 106 at the same time, or approximately the same time, that the data is latched in the input register 106 for the particular data input of the data serializer multiplexer 110. For example, if the input register 106 latches data in a first component of the input register 106, at approximately the same time that the data is latched, the data serializer multiplexer 110 may receive a select signal from the CLK0 bus signal 112A and the CLK1 bus signal 112B to receive/obtain as an input the latched data at the first component of the input register 106. In this configuration, data may arrive and may be latched at an appropriate latch in the input register 106 at approximately the same time that the data serializer multiplexer 110 is ready to receive/obtain the data from the input register 106. This operation is illustrated in more detail in FIG. 4 below.

In some configurations, the synchronous operation described above may be considered as "locking" the timing of the data serializer multiplexer 110 to the input register 106. As will be explained in more detail with respect to FIG. 4 below, this locking aspect may be provided at least in part by the use of the pre-clock signal 114, the CLK0 bus signal 112A, and the CLK1 bus signal 112B. In some configurations, the pre-clock signal 114 may be used to generate the CLK0 bus signal 112A and the CLK1 bus signal 112B, thus further synchronizing the operation of the sender section 102 of the bandwidth amplification circuit 100.

In some configurations, the receiver section 104 may also be synchronized with the output of the data serializer multiplexer 110 of the sender section 102 in one example, the receiver latch 116A is activated on a rising edge of the CLK0 bus signal 112A, the receiver latch 116B is activated on a rising edge of the CLK1 bus signal 112B, the receiver latch 116C is activated on the falling edge of the CLK1 bus signal 112B, and the receiver latch 116B is activated on the falling edge of the CLK0 bus signal 112A. In some examples, the activation of one of the receiver latches 116 may occur at approximately the same time data is made available (or outputted) by the data serializer multiplexer 110. The simultaneous, or near simultaneous output/activation process can hide the delays associated with the data serializer 110 with the delays associated with the receiver latches 116, such as set-up or hold times.

Using the CLK0 bus signal 112A, the CLK1 bus signal 112B, and the pre-clock signal 114 for both the sender section 102 and the receiver section 104, the transmission and receipt of data can be synchronized through the bandwidth amplification circuit 100. In some configurations, the use of the pre-clock signal 114 can achieve a "just in time" operation, wherein data may be present at one of the receiver latches 116 for a processor to read at the same time that data may be present in another one of the receiver latches 116 for another processor (and/or the same processor) to read.

Figure 2:
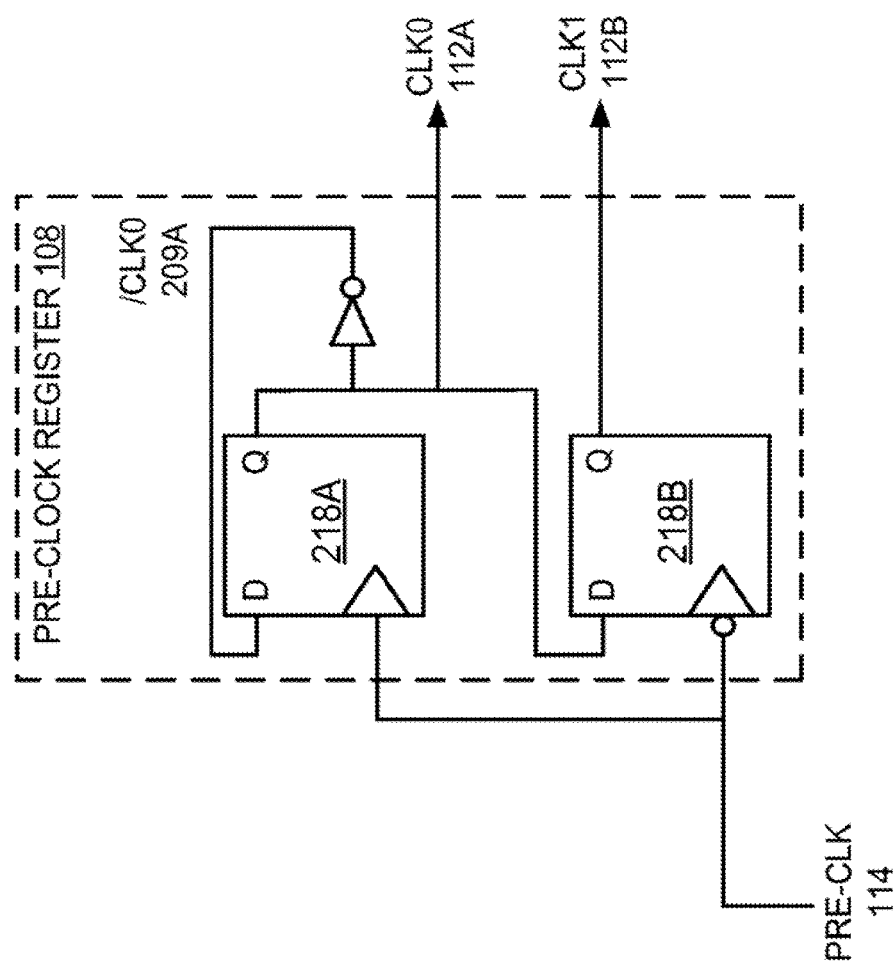
FIG. 2 is a schematic circuit diagram illustrating a pre-clock register for a sender section of the bandwidth amplification circuit of FIG. 1.

FIG. 2 is a schematic circuit diagram illustrating the pre-clock register 108 for the sender section 102 of the bandwidth amplification circuit 100 of FIG. 1, arranged according to at least some embodiments presented herein. As discussed above, the pre-clock register 108 may be used to generate signals, such as the CLK0 bus signal 112A and the CLK1 bus signal 112B, which can be used to operate/control and synchronize various aspects of the bandwidth amplification circuit 100. The signals generated by the pre-clock register 108 may be used as select signals to one or more multiplexers (such as the data serializer multiplexer 110) of the bandwidth amplification circuit 100. The signals generated by the pre-clock register 108 may also be used as enable signals to trigger one or more latches to latch data in a coordinated manner with one or more multiplexers of the bandwidth amplification circuit 100.

The pre-clock register 108 may include a first pre-clock flip-flop 218A having as inputs the pre-clock signal 114 and an inverted CLK0 bus signal 209A, with an output being the CLK0 bus signal 112A. The pre-clock register 108 may also include a second pre-clock flip-flop 218B coupled to the first pre-clock flip-flop 218A and having as inputs an inverted pre-clock signal 114 and the CLK0 bus signal 112A from first pre-clock flip-flop 218A, with an output being the CLK1 bus signal 112B. In some configurations, the CLK0 bus signal 112A and/or the CLK1 bus signal 112B may be used as select signals for the data serializer multiplexer 110 and the like, and thus, in some configurations, may be used interchangeably when used in the context of those configurations.

The first pre-clock flip-flop 218A may be a positive edge triggered flip-flop, while the second pre-clock flip-flop 218B may be a negative edge triggered flip-flop, which in this case, the pre-clock signal need not be inverted. Further, the first pre-clock flip-flop 218A and the second pre-clock flip-flop 218B may be D-type flip-flops, though other types of flip-flops, latches, or devices or combinations thereof may be used.

The pre-clock signal 114 may be a signal with a frequency that is a multiple higher than the frequency of a clock of a data bus or system, depending on the configuration of the particular system. The pre-clock signal 114 may be generated using various technologies, all of which may be used with various configurations of the presently disclosed subject matter. In some configurations, the frequency of the pre-clock signal 114 may be set based on desired bandwidth amplification. A higher frequency may translate to a greater degree of bandwidth amplification. For example, if the pre-clock signal 114 has a frequency that is twice the frequency of the clock for the system, the bandwidth of the sender section 102 of FIG. 1 can be doubled.

Figure 3:
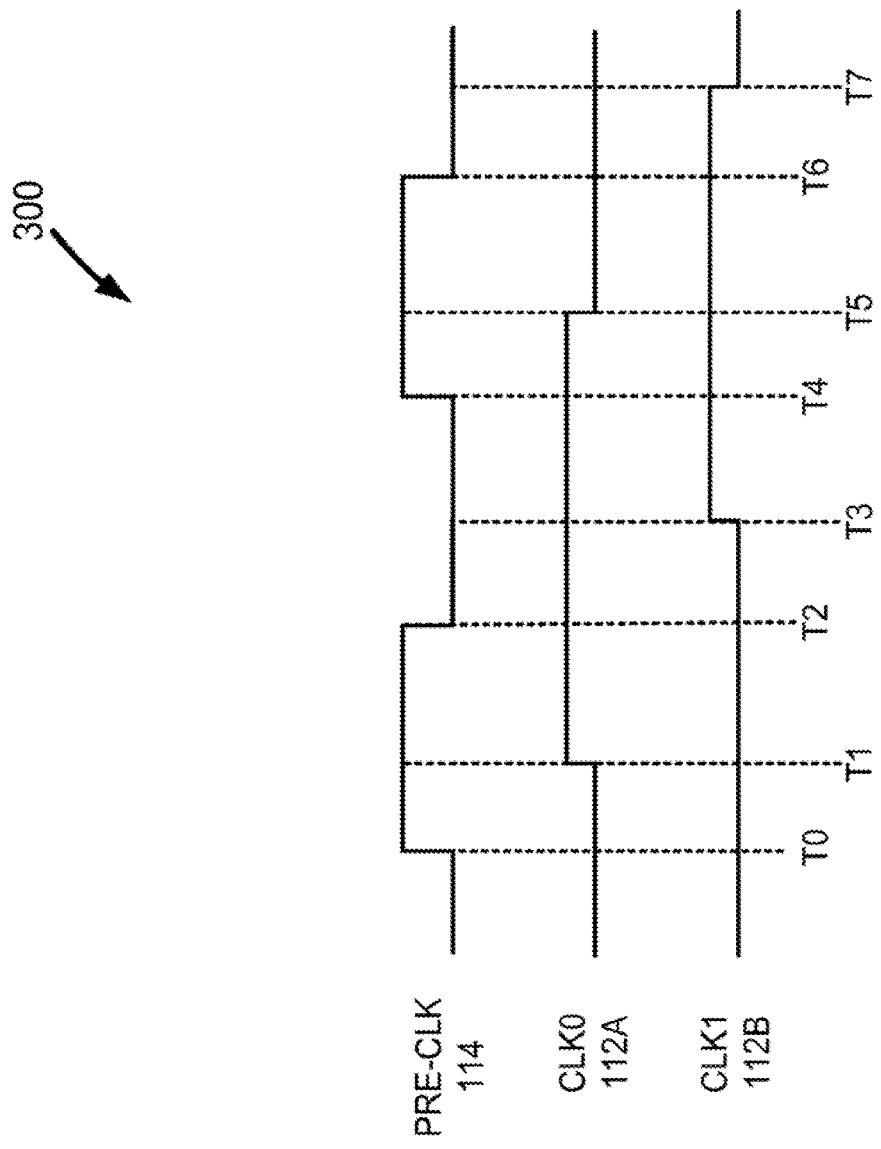
FIG. 3 is an example signal timing diagram for the pre-clock register.

FIG. 3 is an example signal timing diagram 300 for the pre-clock register 108, arranged according to at least some embodiments presented herein. At time T0, the pre-clock signal 114 may go from a logic low state (e.g. 0 volts) to a logic high state (e.g. +5 volts). The first pre-clock flip-flop 218A, being a positive edge triggered flip-flop, is triggered by the leading edge of the pre-clock signal 114 that occurs at time T0. The first pre-clock flip-flop 218A, after a switching delay, changes state at time T1. The CLK0 bus signal 112A goes to a logic high state at time T1. The second pre-clock flip-flop 218B, being a negative edge triggered flip-flop, remains in a logic low state. Thus, the CLK1 bus signal 112B remains in a logic low state.

At time T2, the pre-clock signal 114 transitions from a logic high state to a logic low state. The second pre-clock flip-flop 218B, being a negative edge triggered flip-flop, is triggered by the trailing edge of the pre-clock signal 114 that occurs at time T2. The second pre-clock flip-flop 218B, after a switching delay, changes state at time T3. The CLK1 bus signal 112B goes from a logic low state to a logic high state at time T3. The first pre-clock flip-flop 218A, being a positive edge triggered flip-flop, remains in a logic high state.

At time T4, the pie-clock signal 114 transitions from a logic low state to a logic high state. The first pre-clock flip-flop 218A, being a positive edge triggered flip-flop, is triggered by the leading edge of the pre-clock signal 114 that occurs at time T4. The first pre-clock flip-flop 218A, after a switching delay, changes state at time T5. The CLK0 bus signal 112A goes from a logic high state to a logic low state at time T5. The second pre-clock flip-flop 218B, being a trailing edge triggered flip-flop, remains in a logic high state.

At time T6, the pre-clock signal 114 transitions from a logic high state to a logic low state. The second pre-clock flip-flop 218B, being a negative edge triggered flip-flop, is triggered by the trailing edge of the pre-clock signal 114 that occurs at time T6. The second pre-clock flip-flop 218B, after a switching delay, changes state at time T7. The CLK1 bus signal 112B goes from a logic high state to a logic low state at time T7. The first pre-clock flip-flop 218A, being a positive edge triggered flip-flop, remains in a logic low state.

The configuration illustrated in FIG. 3 represents a pie-clock multiplier of two (2), where the pre-clock is two times the frequency of the CLK0 bus signal 112A and the CLK1 bus signal 112B. In this configuration, the CLK0 bus signal 112A and the CLK1 bus signal 112B may be shifted from one another by 90 degrees. The CLK0 bus signal 112A and the CLK1 bus signal 112B may be shifted out of phase using other pre-clock multipliers. For example, the CLK0 bus signal 112A and the CLK1 bus signal 112B may be approximately sixty degrees out of phase using a pre-clock multiplier of three (3). In another example, the CLK0 bus signal 112A and the CLK1 bus signal 112B may be approximately forty five degrees out of phase using a pre-clock multiplier of four (4). Other pre-clock multipliers may be used and two considered to be within the scope of the presently disclosed subject matter.

In some configurations, the CLK0 bus signal 112A and the CLK1 bus signal 112B may run at the same frequency, in one configuration, the frequency of the CLK0 bus signal 112A and the CLK1 bus signal 112B may be half the frequency of the pre-clock signal 114. Various ratios may be used to achieve various bandwidth amplification factors.

In some configurations, the CLK0 bus signal 112A and the CLK1 bus signal 112B may take the following values in a sequence: 00, 10, 11, 10. In this configuration, the change in the values of clocks follow Gray code, which can increase reliability when the CLK0 bus signal 112A and the CLK1 bus signal 112B are later decoded by a multiplexer as select signals.

In some examples, to synchronize the CLK0 bus signal 112A and the CLK1 bus signal 112B, the inputs of the first pre-clock flip-flop 218A and the second pre-clock flip-flop 218B may be generated from the same CLK0 bus signal 112A. Generating the inputs of the first pre-clock flip-flop 218A and the second pre-clock flip-flop 218B from the same CLK0 bus signal 112A, in some configurations, can increase the likelihood that the first pre-clock flip-flop 218A and the second pre-clock flip-flop 218B start at a same state relative to each other.

Figure 4:
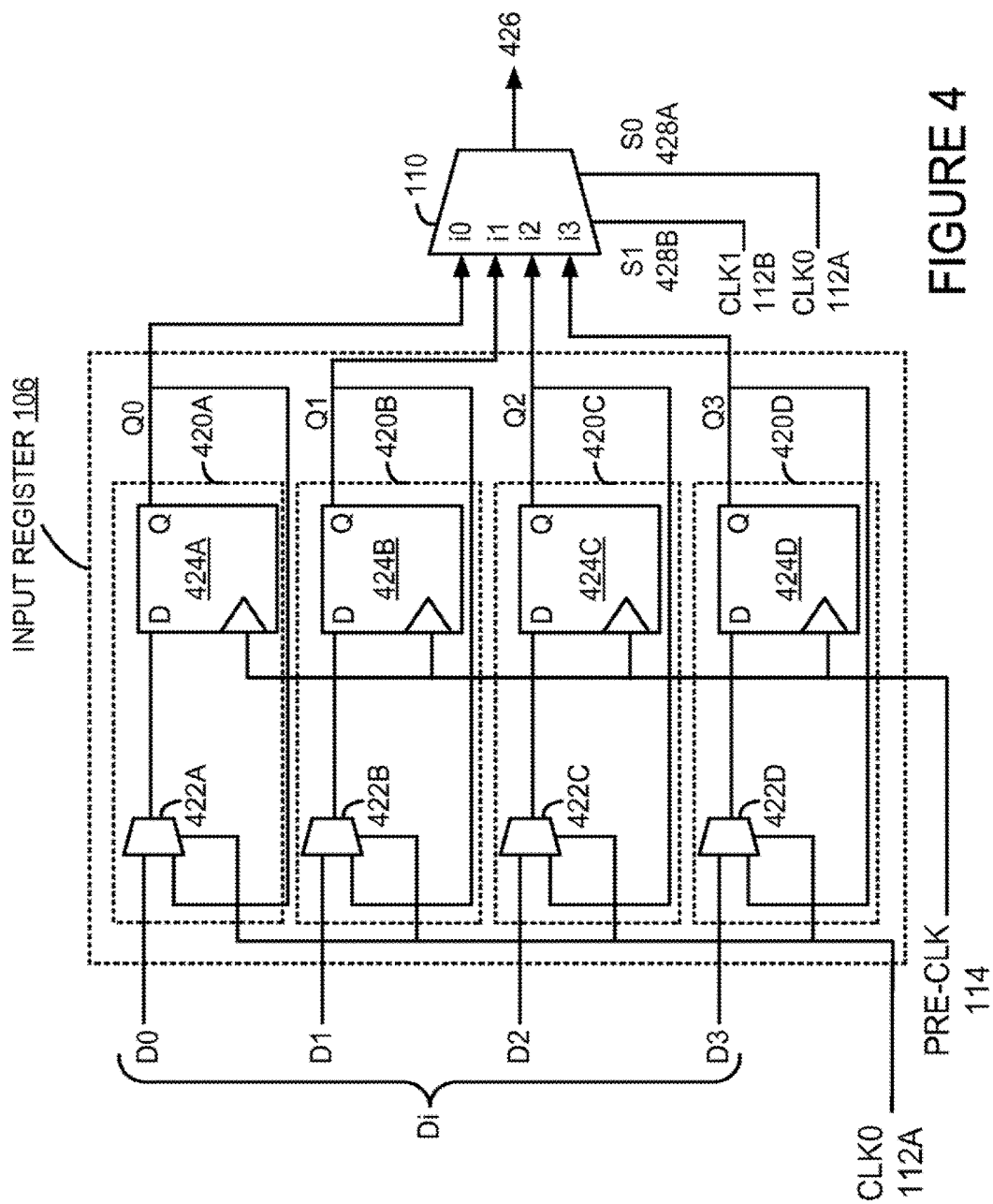
FIG. 4 is a schematic circuit diagram illustrating an example configuration for an input register and data serializer multiplexer of the sender section for the bandwidth amplification circuit of FIG. 1.

FIG. 4 is a schematic circuit diagram illustrating an example configuration of the input register 106 and the data serializer multiplexer 110 of the sender section 102 for the bandwidth amplification circuit 100 of FIG. 1, arranged according to at least some embodiments presented herein. The input register 106 may include pre-clock synchronization circuits 420A-420D (hereinafter also referred to collectively and generically as the "pre-clock synchronization circuits 420"). The pre-clock synchronization circuits 420 may include input multiplexers 422A-422D (hereinafter also referred to collectively and generically as the "input multiplexers 422") and synchronization latches 424A-424D (hereinafter also referred to collectively and generically as the "synchronization latches 424"), respectively. The input multiplexers 422A-422D may be coupled to respective synchronization latches 424A-424D. In one embodiment, each of the synchronization latches 424 may be embodied as a D-type flip-flop.

The pre-clock synchronization circuits 420 may have as inputs data inputs D0-D3, respectively and the CLK0 bus signal 112A. The pre-clock synchronization circuits 420 may have as outputs synchronization circuit data outputs Q0-Q3, respectively. The multiplexer 110 may receive the data outputs Q0-Q3 from the synchronization circuits 420 at multiplexer inputs i0-i3, respectively, of the multiplexer 110. The multiplexer 110 may output data outputs Q0-Q3 to a sender section output 426, which may include the selected data from latched data in one of the synchronization circuits 420. The sender section output 426 may comprise serialized data in one embodiment.

During operation, the pre-clock synchronization circuits 420 may receive data Di at an activated input multiplexer 422. Each of the input multiplexers 422 may receive or otherwise be controlled by the CLK0 bus signal 112A, thereby causing a particular input multiplexer of the input multiplexers 422 to activate to receive the data, and make available the data to its associated synchronization latch 424. The data may be latched in one of the synchronization latches 424 associated with the particular input multiplexer 422 that received the data.

The data serializer multiplexer 110 may receive a select signal to select data from one of the synchronization latches 424 of the pre-clock synchronization circuits 420. In the configuration illustrated in FIG. 4, the CLK0 bus signal 112A and the CLK1 bus signal 112B may act as select signals S0 428A and S1 428B, respectively, for the data serializer multiplexer 110.

As stated above, in some examples, the data serializer multiplexer 110 may be configured to select data at approximately the same time that the data is latched at one of the synchronization latches 424. In the configuration illustrated in FIG. 4, this may be accomplished using the pre-clock signal 114 as an activation signal for the synchronization latches 424 as well as providing the output of the synchronization latches 424 to their respective input multiplexers 422, illustrated in more detail in FIG. 6 below As described in FIG. 3 above, a change in value in the pre-clock signal 114 may precede a change in value in the CLK0 bus signal 112A and the CLK1 bus signal 112B. The delay between a change in the value of the pre-clock signal 114 and a change in value of the CLK0 bus signal 112A and the CLK1 bus signal 112B may be adjusted so that at an approximate time that data is latched in one of the synchronization latches 424, the data serializer multiplexer 110 may be configured to select that data. The timing sequence is explained in more detail in FIG. 5 below.

Figure 5:
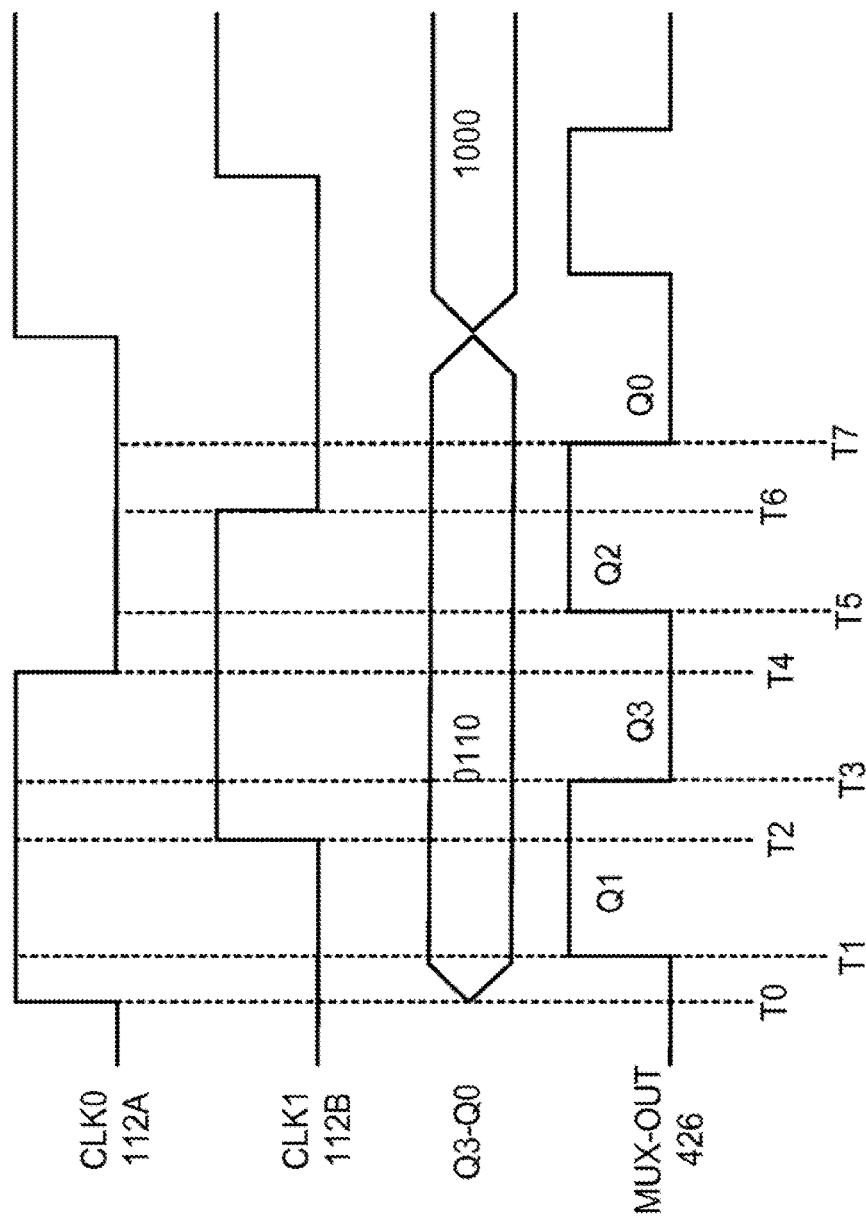
FIG. 5 is an example signal timing diagram illustrating an example of the timing of signals for the input register of FIG. 4.

FIG. 5 is an example signal timing diagram illustrating an example of the timing of signals for the input register 106 of FIG. 4, arranged according to at least some embodiments presented herein. For purposes of explanation, FIG. 5 illustrates the serialization of 4 bit latched data through the data serializer multiplexer 110, which in the present example may be a 4-to-1 multiplexer, using the CLK0 bus signal 112A and the CLK1 bus signal 112B as select signals for the data serializer multiplexer 110.

The output of the data serializer multiplexer 110 may pass in a serial format as the CLK1 bus signal 112B and the CLK0 bus signal 112A change from values 00 to 01 to 11 to 10, for example. The single output of the data serializer multiplexer 110 may be derived from, for example, 4 data bits of information that are multiplexed into a single output using the 90 degree phase shift between the CLK0 bus signal 112A and the CLK1 bus signal 112B.

At time T0, the CLK0 bus signal 112A goes from a logic low state to a logic high state and the CLK1 bus signal 112B remains in its logic low state, corresponding to a selector signal of value 01 provided, to the data serializer multiplexer 110 (the CLK1 bus signal 112B and the CLK0 bus signal 112A). The data serializer multiplexer 110 switches, in response to receiving the selector signal of value 01, to the pre-clock synchronization circuit 420B to receive data output Q1 from the pre-clock synchronization circuit 420B at its input terminal i1. In one example, data is latched into the pre-clock synchronization circuit 420B at approximately the same time that the data serializer multiplexer 110 receives the selector signal to receive an input from the pre-clock synchronization circuit 420B and output the received input at time T1.

At time T2, the CLK0 bus signal 112A remains in a logic high state and the CLK1 bus signal 112B goes to a logic high state, corresponding to a selector signal of value 11. In the configuration illustrated in FIG. 4, the data serializer multiplexer 110 switches, in response to receiving the selector signal of value 11, to the pre-clock synchronization circuit 420D to receive data output Q3 from the pre-clock synchronization circuit 420D at its input terminal i3. In one example, data is latched into the pre-clock synchronization circuit 420D at approximately the same time that the data serializer multiplexer 110 receives the selector signal to receive an input from the pre-clock synchronization circuit 420D and output the received input at time T3.

At time T4, the CLK0 bus signal 112A goes from a logic high state to a logic low state and the CLK1 bus signal 112B remains in its logic high state, corresponding to a selector signal of value 10. In the configuration illustrated in FIG. 4, the data serializer multiplexer 110 switches, in response to receiving the selector signal of value 10, to the pre-clock synchronization circuit 420C to receive data output Q2 from the pre-clock synchronization circuit 420C at its input terminal i2. In one example, data is latched into the pre-clock synchronization circuit 420C at approximately the same time that the data serializer multiplexer 110 receives the selector signal to receive an input from the pre-clock synchronization circuit 420C and output the received input at time T5.

At time T6, the CLK0 bus signal 112A remains in a logic low state and the CLK1 bus signal 112B goes from a logic high state to a logic low state, corresponding to a selector signal of value 00. In the configuration illustrated in FIG. 4, the data serializer multiplexer 110 switches, in response to receiving the selector signal of value 00, to the pre-clock synchronization circuit 420A to receive data output Q0 from the pre-clock synchronization circuit 420A at its input terminal i0. In one example, data is latched into the pre-clock synchronization circuit 420A at approximately the same time that the data serializer multiplexer 110 receives the selector signal to receive an input from the pre-clock synchronization circuit 420A and output the received input at time T7.

Figure 6:
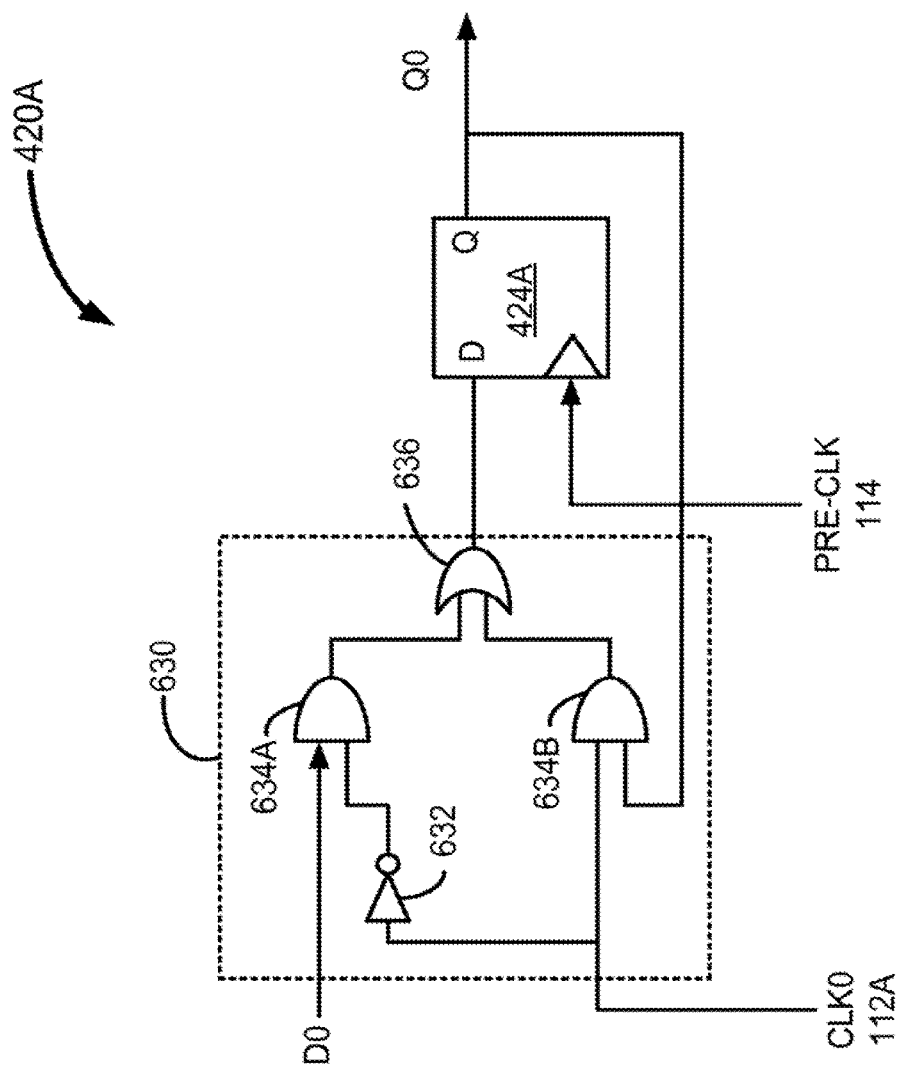
FIG. 6 is a schematic circuit diagram further illustrating a pre-clock synchronization circuit for the input register of FIG. 4.

FIG. 6 is a schematic circuit diagram further illustrating the pre-clock synchronization circuit 420A for the input register 106 of FIG. 4, arranged according to at least some embodiments presented herein. The pre-clock synchronization circuit 420A may be used in conjunction with the other pre-clock synchronization circuits 420B-420D to form the input register 106 of FIG. 1.

The pre-clock synchronization circuit 420A may include the synchronization latch 424A having an input from synchronization multiplexer 630 and the pre-clock signal 114, with a synchronization circuit data output Q0. The synchronization multiplexer 630, which may be used to implement the input multiplexer 422A of FIG. 4 and which may be coupled to the synchronization latch 424A, may include an inverter 632, AND gates 634A, 634B, and OR gate 636 coupled to each other. The output of the OR gate 636 may be received as an input to the synchronization latch 424A. The synchronization multiplexer 630 may receive as an input the CLK0 bus signal 112A, which may be provided as an input to the AND gate 634B and which may be inverted as an input to the AND gate 634A. The synchronization multiplexer 630 may further receive input data D0 at the AND gate 634A. To synchronize the data output Q0 with the pre-clock signal 114, the data output is passed as an input to the AND gate 634B. The output of the AND gate 634B is passed as an input to OR gate 636, which in turn is passed as an input to the synchronization latch 424A.

The synchronization multiplexer 630 may output data to the synchronization latch 424A when the CLK0 bus signal 112A is at a low state, for example. When the CLK0 bus signal. 112A is at a high state, the synchronization multiplexer 630 may pass the same output, explained in more detail in FIG. 7 below. By synchronizing the data output Q0 with the pre-clock signal 114, which is in turn synchronized with the CLK0 bus signal 112A through the pre-clock register 108, the latched data that may be provided as the synchronization circuit data output Q0 may be changed at approximately the same rate and time as the CLK0 bus signal 112A.

Figure 7:
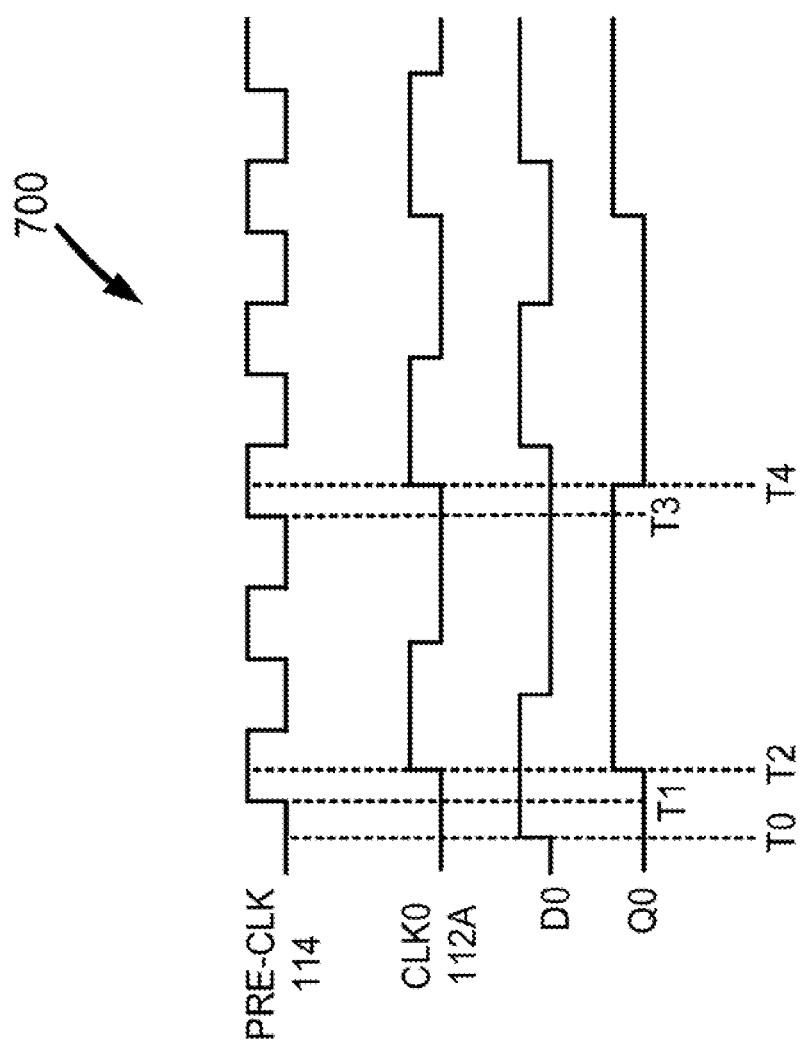
FIG. 7 is an example signal timing diagram for the pre-clock synchronization circuit illustrating an example of the synchronization of data output with a bus signal.

FIG. 7 is an example signal timing diagram 700 for the pre-clock synchronization circuit 420A illustrating an example of the synchronization of the data output Q0 with the CLK0 bus signal 112A, arranged according to at least some embodiments presented herein. The signal timing for the pre-clock signal 114 and the CLK0 bus signal 112A may follow a similar timing pattern as described in the example signal timing diagram 300 of FIG. 3.

In the example shown in FIG. 7, the input data D0 goes from a logic low state to a logic high state at time T0, indicating the presence of data to the bandwidth amplification circuit 100. The pre-clock signal 114 and the CLK0 bus signal 112A may be both logic low states at time T0, resulting in the data output Q0 remaining in a logic low state because the OR gate 636 of the synchronization multiplexer 630 receives as an input two signals having logic low states from the AND gates 634A and 634B.

At time T1, the pre-clock signal 114 transitions from a logic low state to a logic high state. After a delay, at time T2, the CLK0 bus signal 112A transitions from a logic low state to a logic high state. The synchronization latch 424A, being a positive edge triggered flip-flop in one embodiment, is activated by the transition of the pre-clock signal 114 from the logic low state to the logic high state. Once the CLK0 bus signal 112A transitions from the logic low state to the logic high state at time T2, the input data D0 is latched into the synchronization latch 424A, causing the data output Q0 to go high at time T2.

The pre-clock signal 114 transitions from a logic low state to a logic high state between time T2 and time T3. The data input D0 transitions from a logic high state to a logic low state, without the data output Q0 transitioning. As described above, the data output Q0 is synchronized with the CLK0 bus signal 112A, changing state when the CLK0 bus signal 112A is a logic low state.

At time T3, the CLK0 bus signal 112A is at a logic low state. Because of the logic low state of the CLK0 bus signal 112A. The data output Q0 changes from its current logic high state to the logic low state, reflecting the logic low state of the input data D0. As described above, when the CLK0 bus signal 112A is logic low, the input data D0 can be latched in the synchronization latch 424A at the rising edge of pre-clock.

In a similar manner, when the CLK0 bus signal 112A is at a logic high state, the data output Q0 is passed again to the synchronization latch 474A via the synchronization multiplexer 630, maintaining the synchronization latch 424A in its current state. Because the synchronization latch 424A is pre-clocked using the pre-clock signal 114, while synchronizing the latching operation with the CLK0 bus signal 112A, timing delays between Q0 and CLK0 may be compensated for and, in some configurations, at least partially eliminated by the parallel operation described above.

Figure 8:
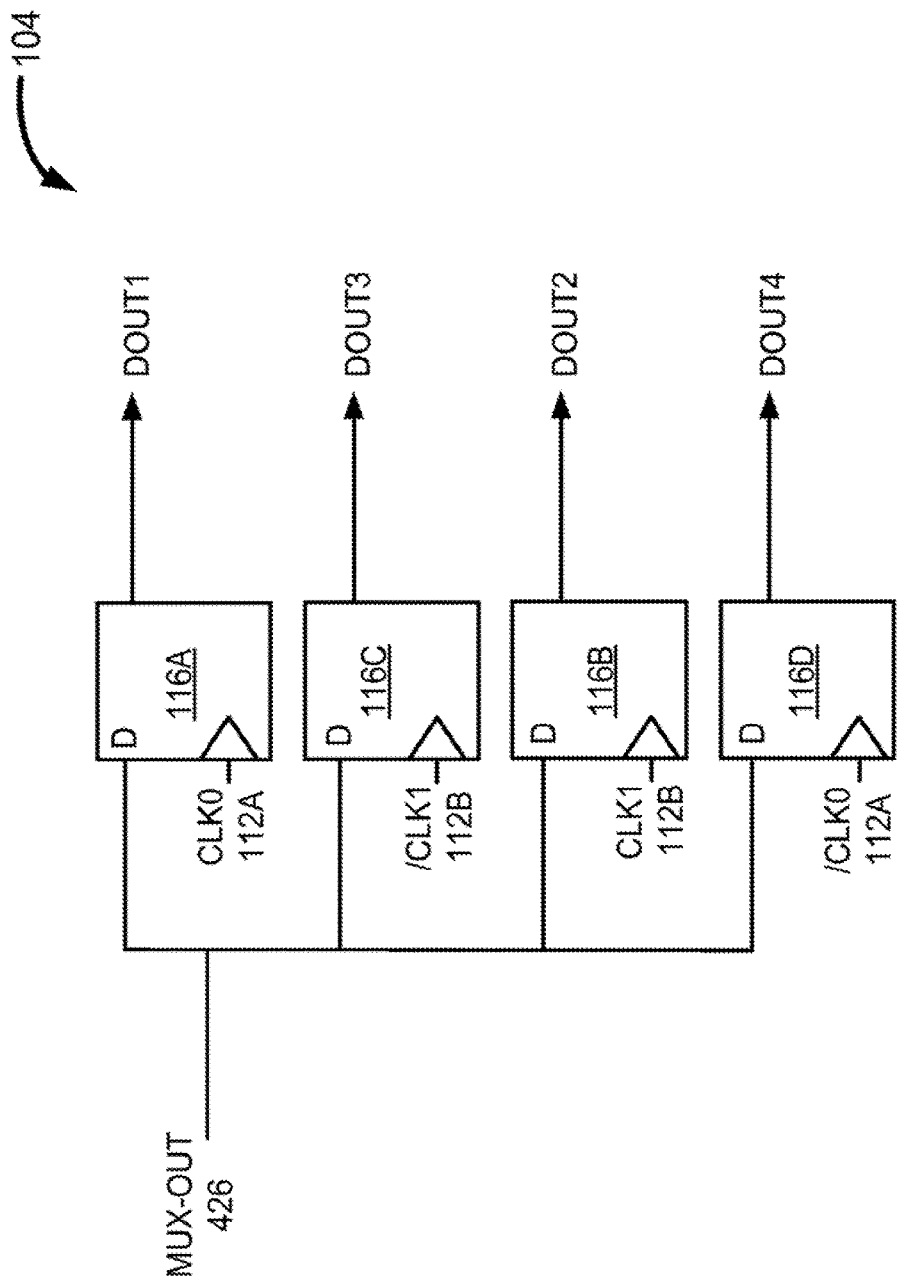
FIG. 8 is a schematic circuit diagram illustrating a receiver section for the bandwidth amplification circuit of FIG. 1 and operative to receive data from the sender section.

FIG. 8 is a schematic circuit diagram illustrating the receiver section 104 for the bandwidth amplification circuit 100 of FIG. 1 and operative to receive data from the sender section 102, arranged according to at least some embodiments presented herein. The receiver section 104 may be configured to receive the sender section output 426 (which may be in the form of serialized data output from the multiplexer 110 of the sender section 102). The receiver section 104 outputs data outputs DOUT1-DOUT4, which may be data made available to components in a computing system that request the data, such as various cores of a multi-core processor. The receiver section 104 may include the receiver latches 116. The receiver latches 116 may be operative to latch data from the sender section output 426 depending on whether or not the receiver latches 116 are activated/operative.

The receiver latches 116 may receive bus signals to activate a particular latch to convert the serialized data received at the sender section output 426, to non-serialized, latched data. To activate a particular one of the receiver latches 116 at a time, the receiver latches 116 are configured to latch the sender section output 426 on rising or falling edges of the CLK0 bus signal 112A or the CLK1 bus signal 112B. Specifically, the receiver latch 116A may latch the sender section output 426 on a rising edge of the CLK0 bus signal 112A, the receiver latch 116B may latch the sender section output 426 on the rising edge of the CLK1 bus signal 112B, the receiver latch 116C may latch the sender section output 426 on a falling edge of the CLK1 bus signal 112B, and the receiver latch 116D may latch the sender section output 426 on a falling edge of the CLK0 bus signal 112A. The operation of the receiver section 104 is explained in more detail in conjunction with FIG. 9 below.

Figure 9:
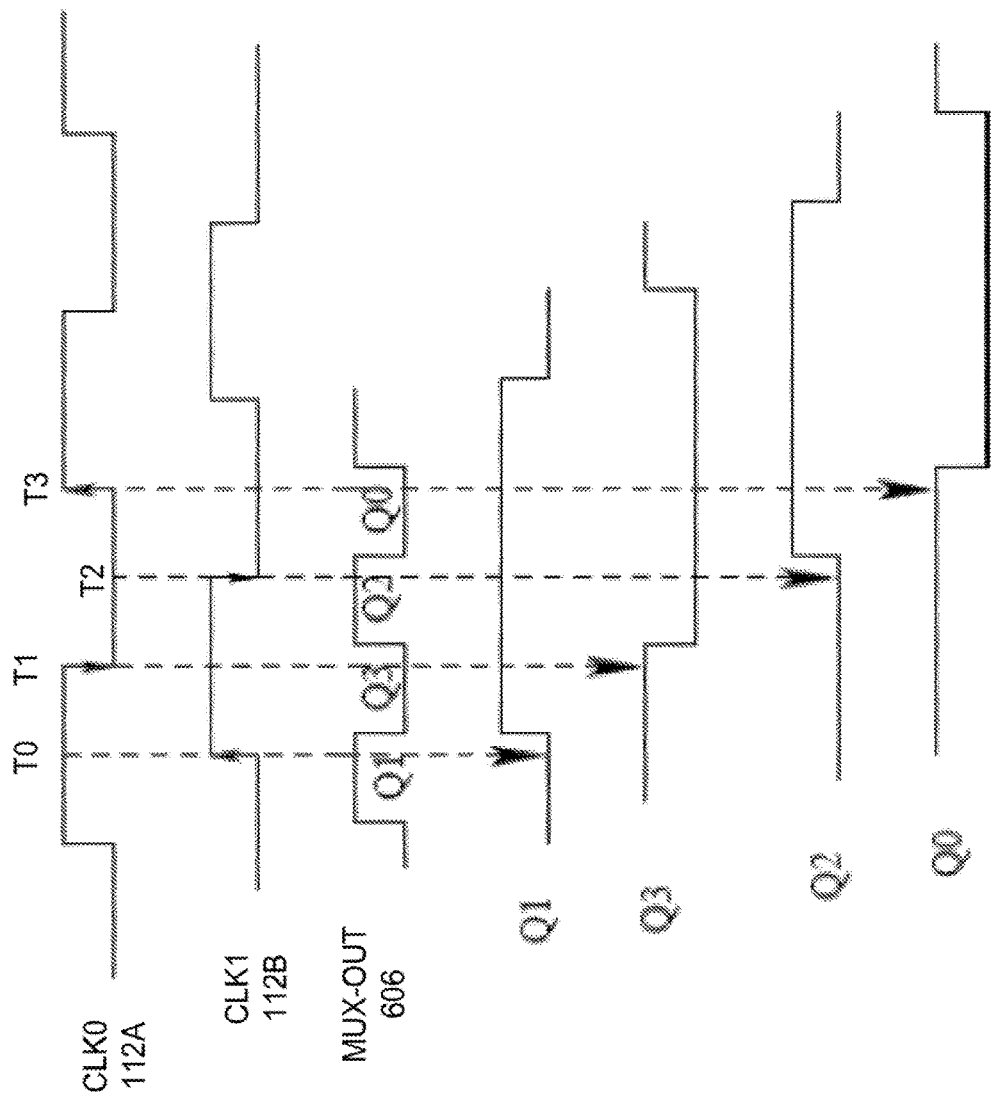
FIG. 9 is an example signal timing diagram for the receiver section of FIG. 8.

FIG. 9 is an example signal timing diagram for the receiver section 104 shown in FIG. 8, arranged according to at least some embodiments presented herein. In this example, the sender section output 426 (MUX-OUT) from the multiplexer 110 is coupled to all 4 of the receiver latches 116. Because the sender section output 426 may be generated from the same bus clocks, e.g. the CLK0 bus signal and the CLK1 bus signal 112B, the delay from the sender section output 426 caused by output multiplexer 110 from the edge of the CLK0 bus signal and the CLK1 bus signal 112B may be utilized to satisfy a desired or required hold and/or setup time for the receiver latches 116. In one example, the receiver latches 116 may use the same 90 degree phase shifted clocks, e.g. the CLK0 bus signal 112A and the CLK1 bus signal 112B, with all of their input data provided by one signal, e.g. the sender section output 426 from the multiplexer 110.

As illustrated by way of example in FIG. 9, the CLK1 bus signal 112B and the CLK0 bus signal 112A may be changing in the order of: values 01, 11, 10, 00. When the CLK1 bus signal 112B and the CLK0 bus signal 112A change from value 0.1 to value 11 at time T0, the receiver latch 116B latches the sender section output 426 on the rising edge of the CLK1 bus signal 112B, which latches as DOUT2 corresponds to Q1 in FIG. 9. Similarly when the CLK1 bus signal 112B and the CLK0 bus signal 112A change from value 11 to value 10 at time T1, the CLK0 bus signal 112A, the receiver latch 116D latches the sender section output 426 on the falling edge of the CLK0 bus signal 112A to latch DOUT4 corresponds to Q3.

When the CLK1 bus signal 112B and the CLK0 but signal 112A change from value 10 to value 00 at time T2, the receiver latch 116C latches the sender section output 426 on the falling edge of the CLK1 bus signal 112B to latch the sender section output 426 as the data output DOUT2 corresponds to Q2. When the CLK1 bus signal 112B and the CLK0 bus signal 112A change from value 00 to value 01 at time T3, the receiver latch 116A latches the sender section output 426 on the rising edge of the CLK0 bus signal 112A to latch the sender section output 426 as the data output DOUT1 corresponds to Q0.

Figure 10:
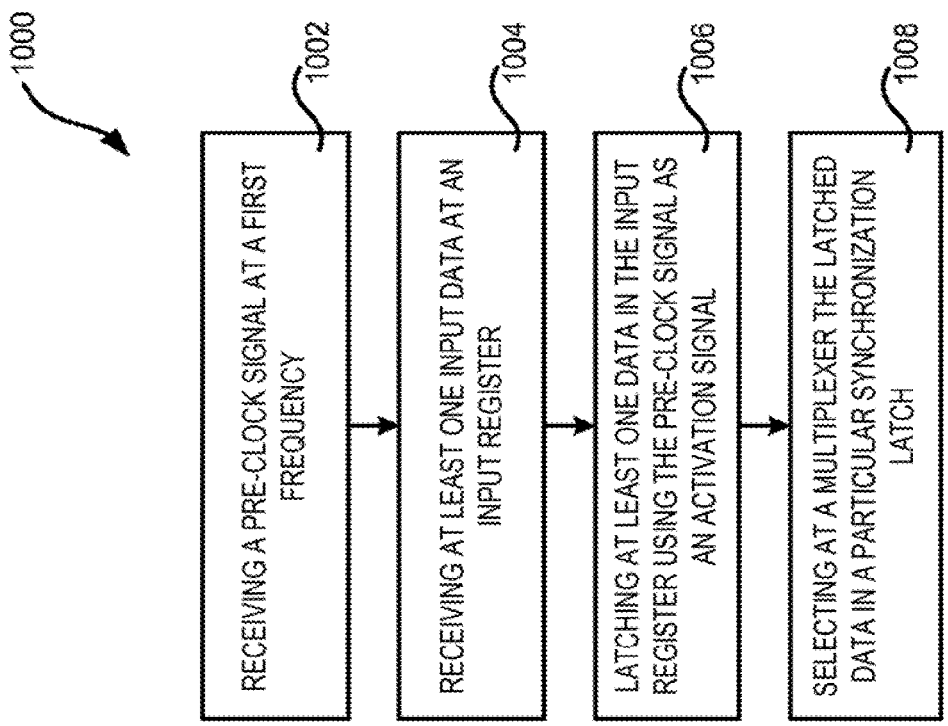
FIG. 10 is a flow diagram illustrating an example process to increase a rate of data transfer.

FIG. 10 is a flow diagram illustrating an example process 1000 to increase a rate of data transfer, in accordance with at least some embodiments described herein. The operations of any process described herein are not necessarily presented in any particular order and that performance of some or all of the operations in an alternative order(s) is possible and is contemplated. The operations have been presented in the demonstrated order for ease of description and illustration. Operations may be added, combined, modified, omitted, and/or performed simultaneously, in a different order, etc., without departing from the scope of the present disclosure.

The illustrated processes can be ended at any time and need not be performed in its entirety. Some or all operations of the processes, and/or substantially equivalent operations, can be performed by execution of computer-readable instructions included on a computer storage media, as defined herein, including a tangible non-transitory computer-readable storage medium. The term "computer-readable instructions," and variants thereof, as used in the description and claims, is used expansively herein to include routines, applications, application modules, program modules, programs, components, data structures, algorithms, or the like. Computer-readable instructions can be implemented on various system configurations, including single-processor or multiprocessor systems, minicomputers, mainframe computers, personal computers, hand-held computing devices, microprocessor-based, programmable consumer electronics, combinations thereof, or the like. For purposes of illustrating and describing the concepts of the present disclosure, the process 1000 is described as being performed, at least in part, by the bandwidth amplification circuit 100. This embodiment is illustrative, and the process 1000 may be performed in other ways.

The process 1000 may begin at operation 1002 ("Receiving a pre-clock signal at a first frequency"), where the pre-clock signal 114 is received at the input register 106 of the sender section 102. As described in FIG. 1, the pre-clock signal 114 may be generated by various components of a computing system. The pre-clock signal 114 may have a frequency operative to increase the bandwidth, or rate of transfer of data through the bandwidth amplification circuit 100, to a certain amount. For example, a doubling of the frequency of the clock of the system bus may double the rate at which data is transferred through the bandwidth amplification circuit.

The process 1000 may continue to operation 1004 ("Receiving at least one input data at an input register"), where at least one input data Di is received at the input register 106. The data Di may come from various sources, described by way of example in FIG. 1, above, depending on the particular arrangement of the sender section 102 and the receiver section 104.

The process 1000 may continue to operation 1006 ("Latching at least one data in the input register using the pre-clock signal as an activation signal"), where at least one input data is latched in the input register 106. The data may be latched in one of the synchronization latches 424 in some configurations, the pre-clock signal 114 may be used as an activation signal to active a particular one of the synchronization latches 424 in the input register 106.

The process 1000 may continue to operation 1008 ("Selecting at a multiplexer the latched data in a particular synchronization latch"), where, at a multiplexer (such as the multiplexer 110), the latched data is selected for output to a receiver section as serialized data output. In some configurations, at the same time, or approximately the same time, that the data is latched in one of the synchronization latches 424, the data serializer multiplexer 110 receives the CLK0 bus signal 112A and the CLK1 bus signal 112B as selector signals. The control signals point the data serializer multiplexer 110 input to the particular one of the synchronization latches 424. The process can thereafter end.

Figure 11:
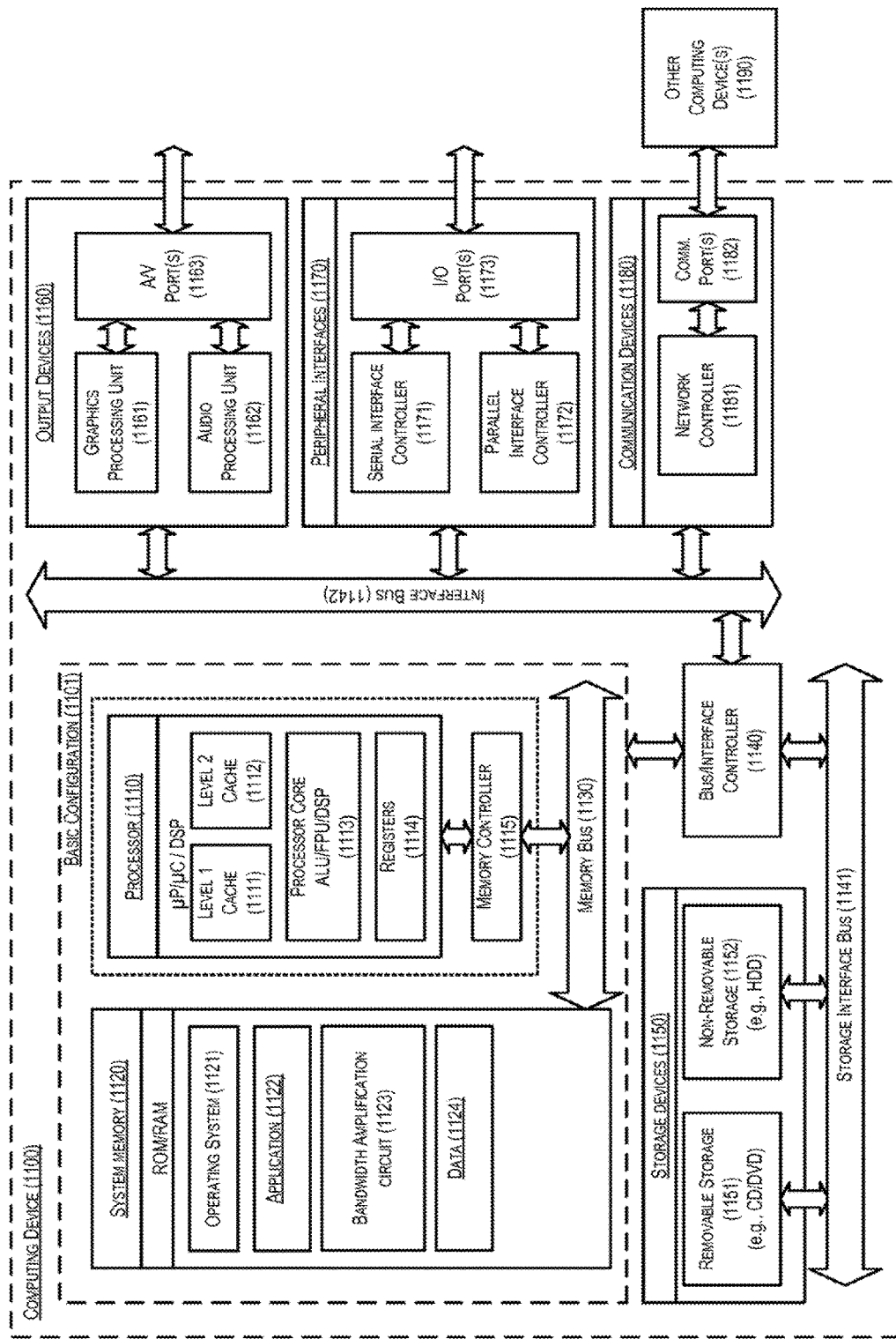
FIG. 11 is a block diagram illustrating an example computing device that is arranged to implement a bandwidth amplification circuit using a pre-clock, all arranged according to at least some embodiments presented herein.

FIG. 11 is a block diagram illustrating an example computing device 1100 that is arranged to implement a bandwidth amplification circuit using a pre-clock arranged in accordance with at least some embodiments described herein. In a very basic configuration 1101, computing device 1100 typically includes one or more processors 1110 and system memory 1120. A memory bus 1130 can be used for communicating between the processor 1110 and the system memory 1120.

Depending on the desired configuration, processor 1110 can be of any type including but not limited to a microprocessor ("µP"), a microcontroller ("µC"), a digital signal processor ("DSP"), or any combination thereof. Processor 1110 can include one more levels of caching, such as a level one cache 1111 and a level two cache 1112, a processor core 1113, and registers 1114. The processor core 1113 can include an arithmetic logic unit ("ALU"), a floating point unit ("FPU") a digital signal processing core ("DSP Core"), or any combination thereof. A memory controller 1115 can also be used with the processor 1110, or in some implementations the memory controller 1115 can be an internal part of the processor 1110. The processor 1110 can be a multi-core processor having two or more independent processing units ("cores").

Depending on the desired configuration, the system memory 1120 can be of any type including but not limited to volatile memory (such as RAM), non-volatile memory (such as ROM, flash memory, etc.) or any combination thereof. System memory 1120 typically includes an operating system 1121, and may include or be coupled to a bandwidth amplification circuit 1122. The bandwidth amplification circuit 1122 may be configured in a manner similar to the bandwidth amplification circuit 100 of FIG. 1. The bandwidth amplification circuit 1122 may provide data 1124 to various requesting components, such as the processor 1110. This described basic configuration is illustrated in FIG. 11 by those components within dashed line 1101.

Computing device 1100 can have additional features or functionality, and additional interfaces to facilitate communications between the basic configuration 1101 and any required devices and interfaces. For example, a bus/interface controller 1140 can be used to facilitate communications between the basic configuration 1101 and one or more data storage devices 1150 via a storage interface bus 1141. The data storage devices 1150 can be removable storage devices 1151, non-removable storage devices 1152, or a combination thereof. Examples of removable storage and non-removable storage devices include magnetic disk devices such as flexible disk drives and hard-disk drives ("HDD"s), optical disk drives such as compact disk ("CD") drives or digital versatile disk ("DVD") drives, solid state drives ("SSD"s), and tape drives to name a few. Example computer storage media can include volatile and nonvolatile, removable and non-removable media implemented in any method or technology for storage of information, such as computer readable instructions, data structures, program modules, or other data.

System memory 1120, removable storage devices 1151 and non-removable storage devices 1152 are all examples of computer storage media. Computer storage media includes, but is not limited to, RAM, ROM, EEPROM, flash memory or other memory technology, CD-ROM, digital versatile disks ("DVD"s) or other optical storage, magnetic cassettes, magnetic tape, magnetic disk storage or other magnetic storage devices, or any other medium which can be used to store the desired information and which can be accessed by computing device 1100. Any such computer storage media can be part of the computing device 1100.

Computing device 1100 can also include an interface bus 1142 for facilitating communication from various interface devices (e.g., output interfaces, peripheral interfaces, and communication interfaces) to the basic configuration 1101 via the bus/interface controller 1140. Example output devices 1160 include a graphics processing unit 1161 and an audio processing unit 1162, which can be configured to communicate to various external devices such as a display or speakers via one or more A/V ports 1163. Example peripheral interfaces 1170 include a serial interface controller 1171 or a parallel interface controller 1172, which can be configured to communicate with external devices such as input devices (e.g., keyboard, mouse, pen, voice input device, touch input device, etc.) or other peripheral devices (e.g., printer, scanner, etc.) via one or more I/O ports 1173. An example communication device 1180 includes a network controller 1181, which can be arranged to facilitate communications with one or more other computing devices 1190 over a network communication via one or more communication ports 1182. The communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, communication media can include wired media such as a wired network or direct-wired connection, and wireless media such as acoustic, radio frequency ("RF"), infrared ("IR"), Fiber Optics, and other wireless media. The term computer readable media as used herein can include both storage media and communication media.

Computing device 1100 can be implemented as a portion of a small-form factor portable (or "mobile") electronic device such as a cell phone, a personal data assistant ("PDA"), a personal media player device, a wireless web-watch device, a personal headset device, an application specific device, or a hybrid device that include any of the above functions. Computing device 1100 can also be implemented as a personal computer including both laptop computer and non-laptop computer configurations.

The present disclosure is not to be limited in terms of the particular embodiments described in this application, which are intended, as illustrations of various aspects. Many modifications and variations can be made without departing from its spirit and scope. Functionally equivalent methods and apparatuses within the scope of the disclosure, in addition to those enumerated herein, are possible. Such modifications and variations are intended to fall within the scope of the appended claims. The present disclosure is to be limited only by the terms of the appended claims, along with the full scope of equivalents to which such claims are entitled. This disclosure is not limited to particular methods, compounds, or compositions, which can, of course, vary. The terminology used herein is for the purpose of describing particular embodiments only, and is not intended to be limiting.

For example, other types of circuits may be used in lieu of the multiplexers, flip flops, logic gates, and the like. Further, the processes of latching have been described for purposes of illustrating a configuration of the presently disclosed subject matter. Other memory access technologies and techniques may be used and are still considered to be within the scope of the present disclosure. Additionally, for purposes of clarity, one or more components of the circuits in the figures may not be illustrated but may be included. The circuits illustrated are not limited to the components illustrated and may include more or fewer components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of art introduced, claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations.

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include, but not be limited to, systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

Further, the use of the terms "first," "second," "third," "fourth," and the like is to distinguish between repeated instances of a component or a step in a process and does not impose a serial or temporal limitation unless specifically stated to require such serial or temporal order.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," or the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A method to increase a rate or an amount of a data transfer, the method comprising:
   receiving, at an input register of a sender section, a pre-clock signal that has a first frequency;
   receiving, at the input register, at least one input data;
   latching the at least one input data in the input register using the pre-clock signal as an activation signal to provide latched data; and
   selecting, at a multiplexer of the sender section, the latched data to be output to a receiver section as serialized data output at approximately a same time the latched data is latched and becomes available in the input register using bus signals synchronized with the pre-clock signal to generate the serialized data output,
   wherein the bus signals comprise a first bus signal and a second bus signal that are approximately one half of the first frequency.

2. The method of claim 1, further comprising:
   generating the bus signals from the pre-clock signal.

3. The method of claim 1, wherein:
   the first bus signal is approximately ninety degrees out of phase relative to the second bus signal using a pre-clock multiplier of two,
   the first bus signal is approximately sixty degrees out of phase relative to the second bus signal using a pre-clock multiplier of three, or
   the first bus signal is approximately forty-five degrees out of phase relative to the second bus signal using a pre-clock multiplier of four.

4. The method of claim 1, further comprising:
   receiving the serialized data output at the receiver section.

5. The method of claim 4, further comprising:
   latching the received serialized data output in a receiver latch selected from receiver latches, using the bus signals.

6. The method of claim 5, wherein using the bus signals to latch the serialized data in the selected receiver latch comprises latching the serialized data at:
   a first output latch of the receiver latches configured to latch data on a rising edge of the first bus signal of the bus signals;
   a second output latch of the receiver latches configured to latch data on a falling edge of the first bus signal of the bus signals;
   a third output latch of the receiver latches configured to latch data on a rising edge of the second bus signal of the bus signals; and
   a fourth output latch of the receiver latches configured to latch data on a falling edge of the second bus signal of the bus signals.

7. A circuit apparatus, comprising:
   a sender section configured to receive data from a memory, wherein the sender section comprises:
      an input register configured to:
         selectively receive inputs from the memory, wherein the inputs include the data and a pre-clock signal; and
         provide a data output; and
      a data multiplexer coupled to the input register and configured to:
         receive other inputs that include the data output, the pre-clock signal, and bus signals, wherein the pre-clock signal and the bus signals are configured to synchronize the input register and the data multiplexer, and wherein the data multiplexer is configured to select data from a latch in the input register at approximately a same time the data is latched at the latch in the input register; and
provide a serialized data output; and
a receiver section coupled to the sender section and configured to:
receive the serialized data output from the sender section, wherein the receiver section is operative to be synchronized with the data multiplexer and comprises latches, and wherein the receiver section is configured to receive the pre-clock signal, the bus signals, and the serialized data output.

8. The circuit apparatus of claim 7, wherein:
the data is requested from the memory by a core of a multi-core processor, and
the receiver section is configured to provide the serialized data output to the core.

9. The circuit apparatus of claim 7, wherein the input register comprises pre-clock synchronization circuits configured to selectively receive data from a data bus.

10. The circuit apparatus of claim 9, wherein at least some of the pre-clock synchronization circuits comprise:
a synchronization multiplexer configured to:
receive as an input one of the bus signals and the data from the data bus; and
provide another data output; and
a latch that includes a synchronization latch configured to:
receive the another data output from the synchronization multiplexer and the pre-clock signal; and
provide an additional data output to the data multiplexer.

11. The circuit apparatus of claim 7, wherein the sender section further comprises:
a pre-clock register coupled to the input register and the data multiplexer, wherein the pre-clock register is configured to generate the bus signals from the pre-clock signal.

12. The circuit apparatus of claim 11, wherein the pre-clock register comprises pre-clock flip-flops, and wherein the pre-clock flip-flops are configured to:
receive as an input the pre-clock signal; and
output the bus signals.

13. The circuit apparatus of claim 12, wherein:
at least one of the pre-clock flip-flops comprises a trailing edge triggered flip-flop and at least another one of the pre-clock flip-flops comprises a leading edge triggered flip-flop, and
a combination of the trailing edge triggered flip-flop and the leading edge triggered flip-flop is configured to cause at least two of the bus signals to be approximately ninety degrees out of phase with each other.

14. The circuit apparatus of claim 7, wherein the latches of the receiver section comprise:
a first output latch of receiver latches configured to latch data on a rising edge of a first signal of the bus signals;
a second output latch of the receiver latches configured to latch data on a falling edge of the first signal of the bus signals;
a third output latch of the receiver latches configured to latch data on a rising edge of a second signal of the bus signals; and
a fourth output latch of the receiver latches configured to latch data on a falling edge of the second signal of the bus signals.

15. A system, comprising:
a bus;
a central processing unit coupled to the bus; and
a memory controller coupled to the bus, wherein the memory controller is configured to control a circuit, and wherein the circuit comprises:
a sender section configured to receive data from a memory in response to a request for the data from a requester component, wherein the sender section includes:
an input register configured to:
selectively receive data from the memory;
receive a pre-clock signal input; and
provide a data output;
a data multiplexer coupled to the input register and configured to:
receive the data output, the pre-clock signal, and bus signals from the input register, wherein the pre-clock signal and the bus signals are configured to synchronize the input register and the data multiplexer, and wherein the data multiplexer is configured to select data in the input register at approximately a same time the data is latched in the input register; and
provide a serialized data output; and
a receiver section that is coupled to the sender section and is synchronized with the data multiplexer, wherein the receiver section is configured to:
receive the serialized data output from the sender section to be sent to the requester component;
receive the pre-clock signal from the data multiplexer; and
output data,
wherein the receiver section includes latches, and wherein the latches include:
a first output latch configured to latch data on a rising edge of a first signal of the bus signals;
a second output latch of the receiver latches configured to latch data on a rising edge of a second signal of the bus signals;
a third output latch of the receiver latches configured to latch data on a falling edge of the second signal of the bus signals; and
a fourth output latch of the receiver latches configured to latch data on a falling edge of the first signal of the bus signals.

16. The system of claim 15, wherein the requester component includes a core of the central processing unit.

17. The system of claim 15, wherein the input register comprises pre-clock synchronization circuits configured to selectively receive data from the bus.

18. The system of claim 17, wherein at least some of the pre-clock synchronization circuits comprise:
a synchronization multiplexer configured to:
receive one of the bus signals and the data from the bus; and
provide another output of data; and
a synchronization latch coupled to the synchronization multiplexer and configured to:
receive the another output of data from the synchronization multiplexer and the pre-clock signal; and
provide an additional output to the data multiplexer.

19. The system of claim 15, wherein at least two of the bus signals are approximately ninety degrees out of phase from each other.

* * * * *